United States Patent [19]

Kondo

[11] Patent Number: 5,185,054
[45] Date of Patent: Feb. 9, 1993

[54] METHOD FOR FABRICATING AN EXPOSURE MASK INCLUDING A STEP FOR ADHERING MASK BODY SUBSTRATE TO A SUPPORTING BLOCK

[75] Inventor: Kazuaki Kondo, Kawasaki, Japan

[73] Assignee: Fujitsu Limited, Kawasaki, Japan

[21] Appl. No.: 757,284

[22] Filed: Sep. 10, 1991

[30] Foreign Application Priority Data

Sep. 10, 1990 [JP] Japan .................................. 2-239624

[51] Int. Cl.⁵ ...................... H01L 21/306; B44C 1/22; C23F 1/00
[52] U.S. Cl. .................................. 156/630; 156/656; 156/657; 156/662
[58] Field of Search ............... 156/630, 650, 652, 656, 156/657, 659.1, 662, 664

[56] References Cited

U.S. PATENT DOCUMENTS 4,170,512 10/1979 Flanders et al. ..................... 156/631

Primary Examiner—William A. Powell
Attorney, Agent, or Firm—Staas & Halsey

[57] ABSTRACT

A method for fabricating an exposure mask includes steps of: forming a layered body comprising a substrate, a membrane transparent to an X-ray and provided on the upper major surface of the substrate, and an X-ray absorbing film provided on the membrane; adhering a support ring on a lower major surface of the substrate; carrying out etching on an area on the lower major surface of the substrate until a lower major surface of the membrane is exposed, the area corresponding to an inside of the support ring block; and patterning the X-ray absorbing film into a desired semiconductor pattern. The step of adhering the substrate to the support ring includes steps of placing an adhesive layer between a lower major surface of the layered body and the upper major surface of the support ring; and adhering the layered body to the support ring by applying a gas pressure on an upper major surface of the layered body so that the layered body is pressed via the adhesive layer against the support ring and adhered thereto by the adhesive layer.

14 Claims, 6 Drawing Sheets

FIG. IA (PRIOR ART)
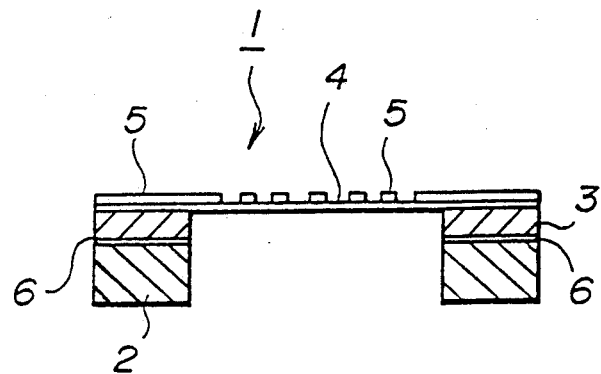
FIG. IB (PRIOR ART)
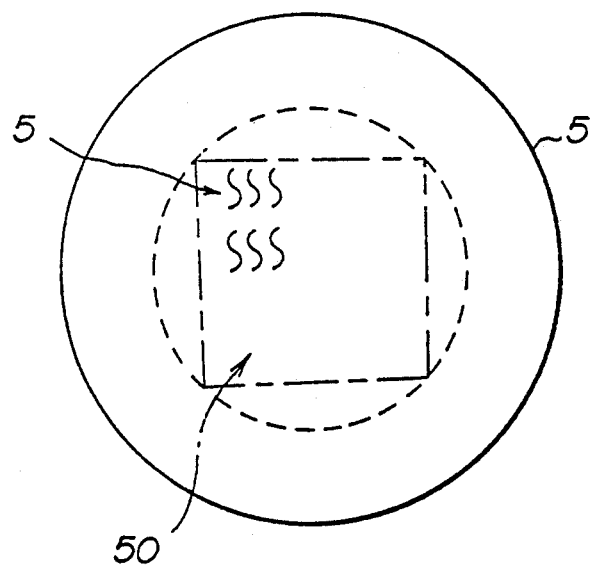

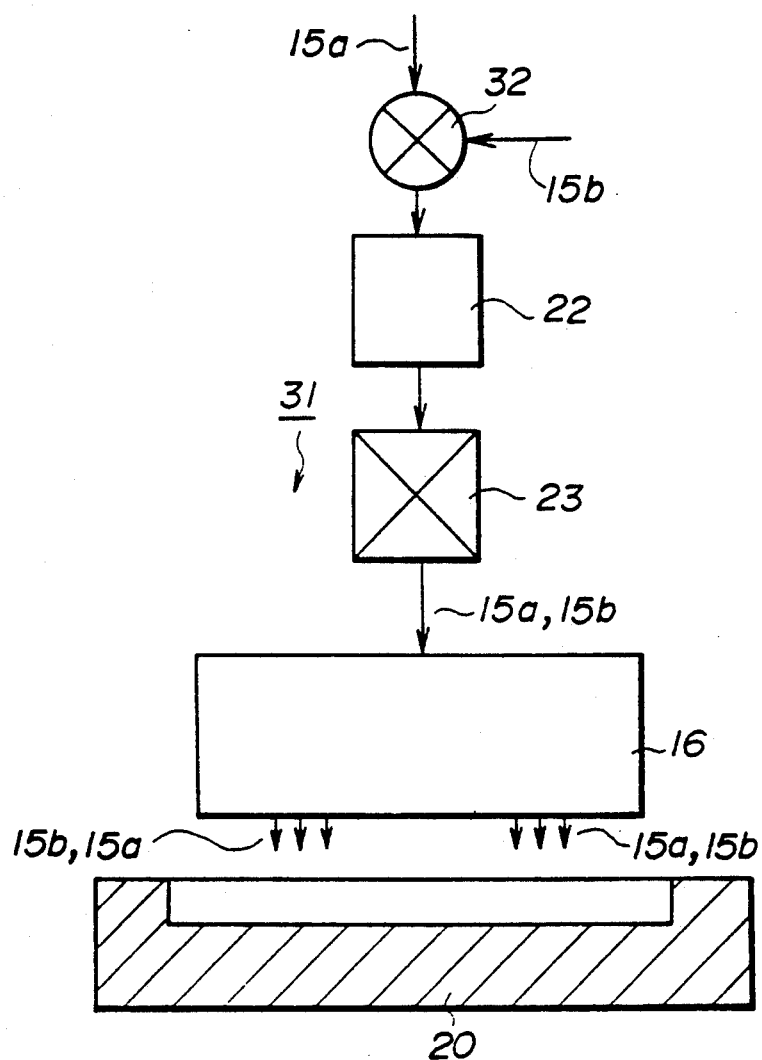

METHOD FOR FABRICATING AN EXPOSURE MASK INCLUDING A STEP FOR ADHERING MASK BODY SUBSTRATE TO A SUPPORTING BLOCK

BACKGROUND OF THE INVENTION (1) Field of the Invention

The present invention generally relates to a method for fabricating an exposure mask, such as an X-ray exposure mask, which is used for manufacturing semiconductor devices; and more particularly to a method for fabricating an exposure mask which includes a step of adhering a substrate to a supporting block.

(2) Description of Related Art

FIG. 1A is an end view showing an X-ray exposure mask, FIG. 1B is a top view showing the X-ray exposure mask, and FIGS. 2A-2E illustrate a conventional method for fabricating the X-ray exposure mask.

Referring to FIGS. 1A and 1B, an X-ray mask 1 has a reinforcement block 2 (a supporting block), a silicon ring 3, a membrane 4 that is transparent to X-rays, and an X-ray absorbing pattern 5. The reinforcement block 2 serves for mechanically reinforcing the X-ray mask 1. The reinforcement block 2 may be made of SiC. The reinforcement block 2 is ring-shaped. The silicon ring 3 is adhered to an upper main surface of the reinforcement block 2 by an adhesive 6. The membrane 4 which is made, for example, of SiC, is provided on the silicon ring 3. The X-ray absorbing pattern 5 which is made, for example, of Ta, is formed on the membrane 4. The X-ray pattern 5 is patterned according to the desired semiconductor pattern as usual.

The X-ray mask 1 having the above structure is formed in accordance with a process shown in FIGS. 2A-2E.

In the step of FIG. 2A, the membrane 4 is deposited on an upper major surface of a silicon wafer 7 by a CVD process. The membrane 4 is made, for example, of Sic as already noted. Then an X-ray absorbing film 8 which is made, for example, of Ta is deposited on the membrane 4 by sputtering.

In the step of FIG. 2B, the adhesive 6 which is a sheet-shaped thermosetting adhesive is provided on the reinforcement block 2, and a layered body 107 shown in FIG. 2A is placed on the adhesive 6 so that the adhesive 6 is sandwiched between the reinforcement ring block 2 and the silicon wafer 7.

In the step of FIG. 2C, a structure formed of the reinforcement block 2, the adhesive 6, the silicon wafer 7, the membrane 4, and the X-ray absorbing film 8, shown in FIG. 2B, is set in a concave part 11 of a heater plate 10 which contains a heater 9 therein. Then, a pressure device 12 is brought into contact with a fringe area on the upper major surface of the X-ray absorbing film 8 directly or via sheet of soft material such that the pressure device 12 presses the stacked structure against the heater plate 10 for a predetermined time (e.g. 5 min.). That is, the silicon wafer 7 is pressed via the adhesive 6 to the upper major surface of the reinforcement block 2. During this process, electric power is supplied to the heater 9 so that the adhesive 6 is heated at its curing temperature (e.g. 180° C.). As a result, the silicon wafer 7 is firmly adhered to the upper major surface of the reinforcement block 2 by the adhesive 6.

In the step of FIG. 2D, an etching process is carried out on a lower surface of the silicon wafer 7 until a lower surface of the membrane 4 is exposed, so that the silicon ring 3 is formed from the silicon wafer 7.

In the step of FIG. 2E, an etching process is carried out on the X-ray absorbing film 8 so that the X-ray absorbing pattern 5 is formed on the membrane 4.

In accordance with the above process, the X-ray exposure mask shown in FIGS. 1A and 1B is formed. The above X-ray absorbing pattern 5 can be also formed on the membrane 4 before the silicon wafer 7 is adhered to the reinforcement block 2.

In the above conventional method for fabricating the X-ray exposure mask, the pressure device 12 is employed in direct contact with the layered body 107 including the silicon wafer 7 to press the layered body 107 against the reinforcement block 2 when the layered body 107 is adhered to the reinforcement block 2 (the supporting block) by the adhesive 6. Thereby, there is a risk that unwanted dust particles present on the pressure device 12 may be transferred to a surface of the X-ray absorbing film 8. When such dust particles exist on the surface of the X-ray absorbing film 8, there is a substantial risk that the mask pattern may be damaged upon the proximity exposure process that is conducted by using the mask. Once present, it is difficult to remove these particles from the surface of the X-ray absorbing film 8 (the X-ray absorbing pattern 5) by washing.

SUMMARY OF THE INVENTION

Accordingly, a general object of the present invention is to provide a novel and useful method for fabricating an exposure mask in which the disadvantages of the aforementioned prior art are eliminated.

A more specific object of the present invention is provide a method for fabricating an exposure mask that eliminates adhering of particles on a mask body, particularly when the layered body of the mask is adhered to a supporting block by an adhesive.

The above objects of the present invention are achieved by a method for fabricating an exposure mask comprising the following steps (a) through (d) of: (a) forming a substrate having a base wafer, a membrane through which an X-ray can be transmitted, the membrane being formed on the base wafer, and an X-ray absorbing film formed on the membrane; (b) adhering the substrate to a support ring block which is shaped into a ring and set on a plate; the step (b) having: (b-1) putting an adhesive layer between a lower major surface of the substrate and the support ring block; and (b-2) applying a gaseous pressure on an upper major surface of the substrate so that the substrate is pressed via the adhesive layer against the support ring block and adhered thereto by the adhesive layer; (c) carrying out etching on an area on the lower major surface of the substrate until a lower major surface of the membrane is exposed, the area corresponding to an inside of the support ring block; and (d) patterning the X-ray absorbing film into a desired semiconductor pattern.

The above objects of the present invention are also achieved by a method for adhering a substrate to a support block comprising the following steps (a) and (b) of: (a) putting an adhesive layer between a lower major surface of the substrate and the support block set on a plate; and (b) applying a gaseous pressure on an upper major surface of the substrate so that the substrate is pressed via the adhesive layer against the support ring block and adhered thereto by the adhesive layer.

According to the present invention, in order to adhere the substrate to the supporting block the substrate is pressed via the supporting block by use of gaseous pressure. That is, the substrate can be adhered to the supporting block under conditions in which no material is in contact with the substrate. Thus, it is possible to prevent unwanted particles from adhering to the substrate when the substrate is adhered to the supporting block.

BRIEF DESCRIPTION OF THE DRAWINGS

Additional objects, features and advantages of the present invention will become apparent from the following detailed description when read in conjunction with the accompanying drawings in which:

FIG. 1A is a sectional view showing an X-ray exposure mask;

FIG. 1B is a plan view showing the X-ray exposure mask;

FIG. 9 is a diagram illustrating another example of an apparatus for adhering the substrate to the supporting block, in a method for fabricating an exposure mask, according to the present invention.

DESCRIPTION OF THE PREFERRED EMBODIMENTS

A description will now be given of the principle of the present invention with reference to FIG. 3.

Figure 3:
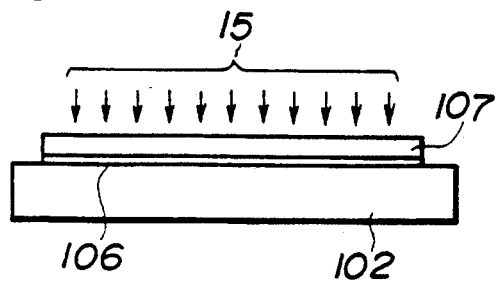
FIG. 3 is a diagram illustrating the principle of adhering a substrate to a supporting block according to the present invention.

Referring to FIG. 3, an adhesive layer 106 is placed on an upper major surface of a supporting block 102, and then a layered body 107 of the mask is placed on the adhesive layer 106 so that the adhesive layer 106 is put between the supporting block 102 and the layered body 107. After this, a gas pressure 15 is applied to a surface of the layered body 107 so that the layered body 107 is pressed via the adhesive layer 106 against the supporting block 102. As a result, the layered body 107 is adhered to the supporting block 102 by the adhesive layer 106.

According to the above method, as the gas pressure 15 presses the layered body 107 against the supporting block 102, there in no device in contact with the surface of the layered body 107 when the layered body 107 is adhered via the adhesive layer 106 to the supporting block 102. Thus, particles are prevented from adhering to the surface of the layered body 107.

A description will now be given of a method for fabricating an X-ray exposure mask according to a first embodiment of the present invention with reference to FIG. 4.

Figure 2A:
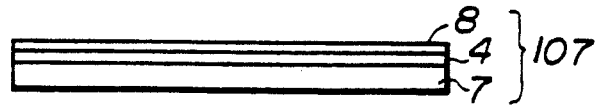
FIGS. 2A–2E are diagrams illustrating a conventional process for fabricating the X-ray exposure mask.
Figure 2B:
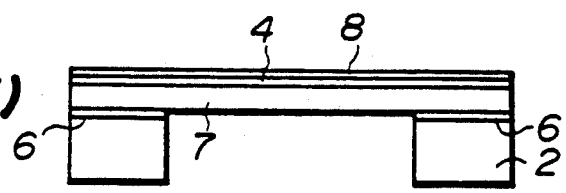
Figure 2C:
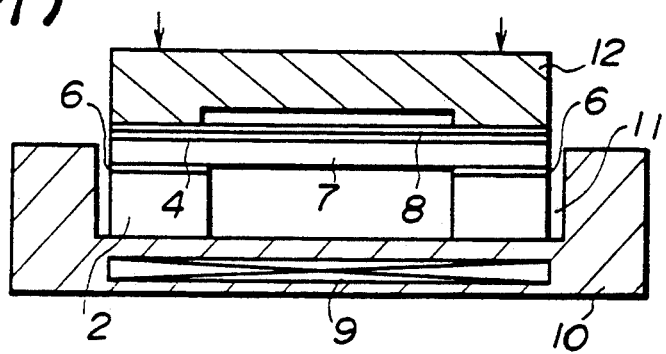
Figure 4A:
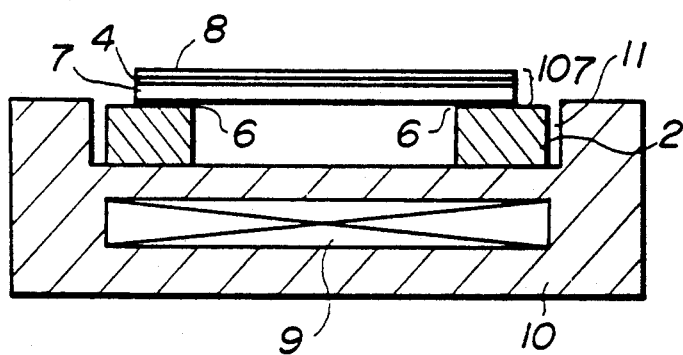
FIGS. 4A and 4B are diagrams illustrating a step of adhering a substrate to a supporting block in a method for fabricating an X-ray exposure mask according to a first embodiment of the present invention.

In the step of FIG. 4A, the membrane 4 of SiC and the X-ray absorbing film 8 are stacked consecutively on the silicon wafer 7 in accordance with the same process as the conventional method shown in FIG. 2A. The adhesive 6, which is a sheet shaped epoxy adhesive, is provided on the reinforcement block 2 (the supporting block) which is ring-shaped. Thereby, the layered body 107 formed of the silicon wafer 7, the membrane 4, and the X-ray absorbing film 8 is placed on the adhesive layer 6 so that the adhesive layer 6 is sandwiched between the silicon wafer 7 and the reinforcement block 2. After this, the layered body 107, in which the adhesive layer 6 is sandwiched between the silicon wafer 7 and the reinforcement block 2 as described above, is set on the concave part 11 of the heater plate 11 which has the heater 9 therein, as shown in FIG. 4A.

Figure 4B:
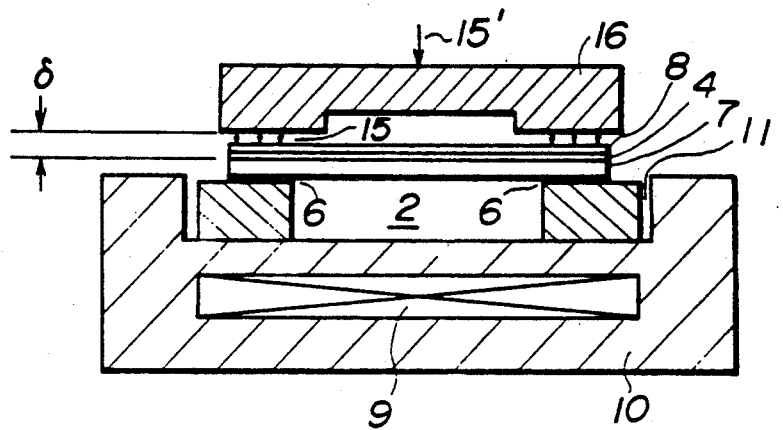

Next, a pressure device 16 is brought closed to the surface of the X-ray absorbing film 8 so that a distance between the surface of the X-ray absorbing film 8 and the pressure device 16 is maintained at $\delta$, as shown in FIG. 4B. The pressure device 16 ejects a gas onto the surface of the X-ray absorbing film 8 so that a gas pressure 15 is applied to the surface of the X-ray absorbing film 8 and hence the layered body 107. While the gas pressure 15 is being applied to the surface of the X-ray absorbing film 8, the electric power is supplied to the heater 9 so that the adhesive 6 is heated via the reinforcement block 2 at a curing temperature thereof. Due to the gas pressure 15, the silicon wafer 7 is pressed via the adhesive 6 against the upper major surface of the reinforcement block 2 at a predetermined pressure. To prevent the silicon wafer 7 from breaking or being damaged, the gas is preferably ejected from the pressure device 16 selectively onto a fringe area on the surface of the X-ray absorbing film 8. The fringe area corresponds to the ring shaped reinforcement block 2.

The gas pressure 15 is adjusted so that the silicon wafer 7 is pressed via the adhesive 6 against the reinforcement block 2 at the pressure required for adhering the silicon wafer 7 to the reinforcement block 2. For example, a gas pressure of 8 kg/cm$^2$ is employed. In a case where the pressure of a gas 15' supplied to the pressure device 16 is maintained at a constant value (e.g. 100 kg), the pressure applied to the silicon wafer 7 by the gas pressure 15 may be controlled, in accordance with the strength of the silicon wafer 7, by adjusting the distance $\delta$ between the pressure device 16 and the surface of the X-ray absorbing film 8. Typically, the distance $\delta$ is set within a range of 3 $\mu$m–10 $\mu$m.

As the distance $\delta$ between the pressure device 16 and the surface of the X-ray absorbing film 8 is very small, the flow rate of gas ejected from the pressure device 16, which is required for obtaining the above pressure, is relatively small. The flow rate of the gas ejected from the pressure device 16 is controlled, for example, at 5 l/min.

Figure 2D:
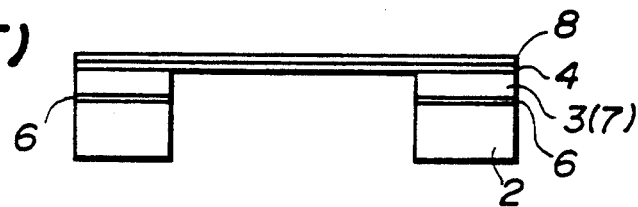
Figure 2E:
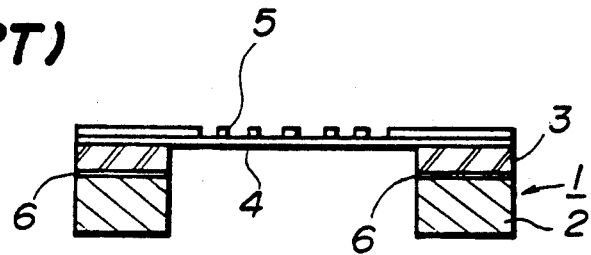

After the silicon wafer 7 is firmly adhered to the reinforcement block 2, the silicon wafer is etched so that the silicon ring 3 is obtained, as shown in the conventional process of FIG. 2D, and then the X-ray absorbing film 8 is etched so that the X-ray absorbing pattern is formed on the membrane 4 according to a desired semiconductor pattern.

Figure 5A:
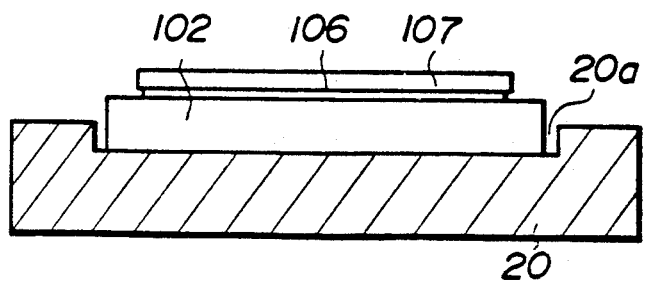
FIGS. 5A and 5B are diagrams illustrating a step of adhering a substrate to a supporting block in a method for fabricating an X-ray exposure mask according to a second embodiment of the present invention.
Figure 5B:
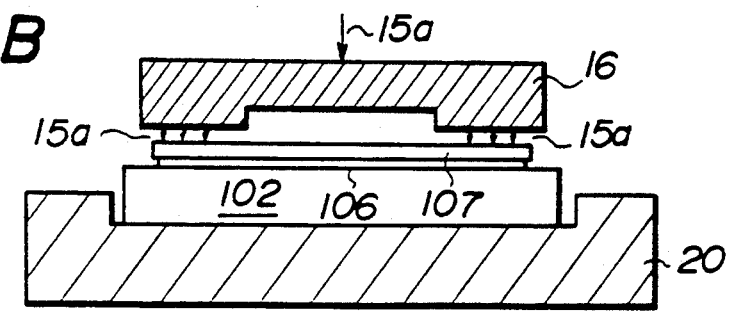

A description will now be given of a second embodiment of the present invention with reference to FIGS. 5A and 5B.

In this embodiment, too, the adhesive layer 106 which is a sheet-shaped epoxy adhesive is placed on the supporting block 102. The layered body 107, which includes the stacked structure of the silicon wafer 7, the membrane 4 and the X-ray absorbing film 8, is placed on the adhesive 106. Then a stacked structure formed of the supporting block 102, the adhesive 106 and the layered body 107 is set in a concave part 20a of a support plate 20, as shown in FIG. 5A. The pressure device 16 is brought close to the surface of the layered body 107, and then a heated gas is ejected from a low major surface of the pressure device 16 so that a high temperature gas pressure 15a is applied to the surface of the layered body 107, as shown in FIG. 5B. The gas may have a temperature of, for example, approximately 200° C. Due to the temperature of the heated gas pressure 15a, the layered body 107 is pressed via the adhesive 106 against the supporting block 102 while being heated at a curing temperature thereof. As a result, the layered body 107 is firmly adhered to the supporting block 102 by the adhesive 106.

In any of the above first and second embodiments, the adhesives 6 and 106 are heated either by the heater 9 or the heated gas pressure 15a. The adhesive 6 which has been heated at the curing temperature thereof for a predetermined period may be cooled, for example, as follows.

Figure 6:
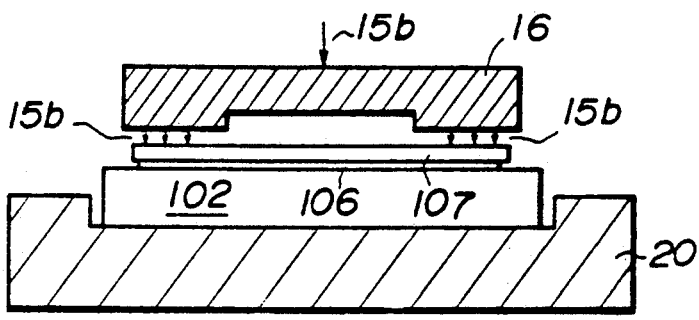
FIG. 6 is a diagram illustrating a step of cooling the substrate which is adhered to the supporting block.

A cooled gas in substitution for the previous gas or the heated gas, is ejected from the pressure device 16, as shown in FIG. 6. In this case, a cooled gaseous pressure 15b is applied to the surface of the layered body 107 through the cooled gas. Thus, the adhesive 6 can be cooled under a condition in which the layered body 107 is pressed via the adhesive 6 against the supporting block at a predetermined pressure. The cooled gas ejected from the pressure device 16 is controlled, for example, at a temperature equal to or less than a room temperature.

A description will now be given of an example of an apparatus used for adhering the layered mask body to the supporting block with reference to FIG. 7.

Figure 7:
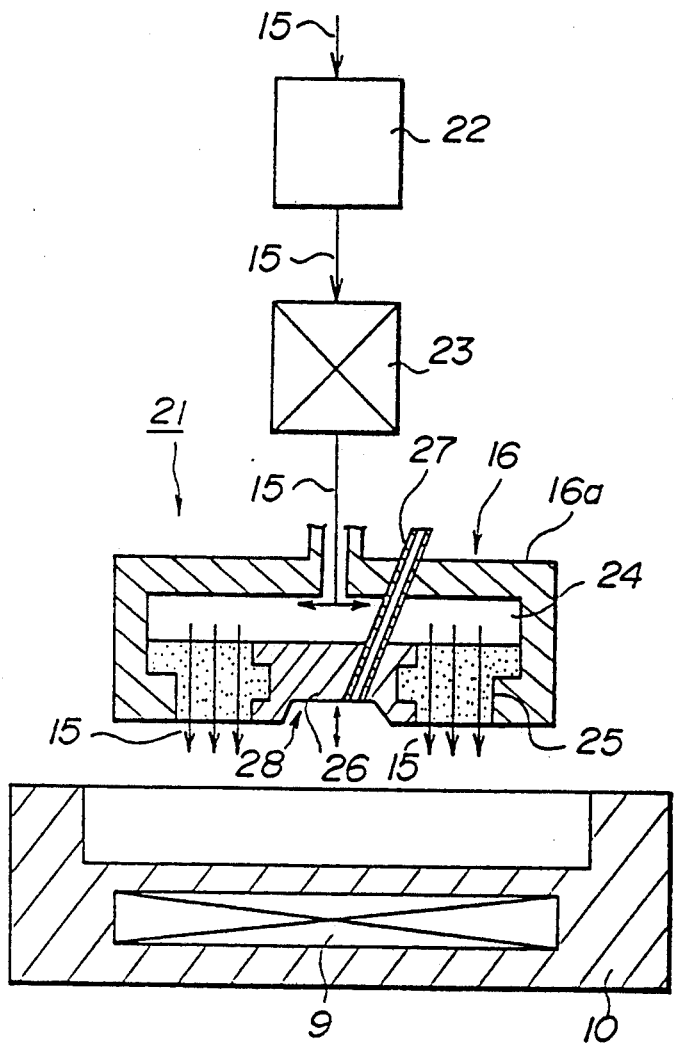
FIG. 7 is a diagram illustrating an example of an apparatus for adhering the substrate to the supporting block in a method for fabricating an exposure mask according to the present invention.

Referring to FIG. 7, an adhering apparatus 21 has a pressure device 16 which is placed over a support plate 10 containing a heater 9 therein so as to be capable of moving upward and downward, a regulator 22, and a filter 23. A gas 15, such as pressured air or pressured inert gas or nitrogen, is supplied, via the regulator 22, to the filter 23. Then the gas 15 filtered by the filter 23 is supplied to the pressure device 16. The pressure device 16 has a housing 16a and a central block 26 and a porous block 25 which is ring-shaped. The porous block 25 is attached between the central block 26 and a side wall of the housing 16a so that a space between the central block 26 and the side wall of the housing 16a is filled with the porous block 25. The housing 16a is closed by the central block 26 and the porous block 25 so that a cavity 24 is formed in the housing 16a. A concave part 28 is formed on an outside surface of the central block 26. A pipe 27 which opens into the concave part 28 is extended through the central block 26, the cavity 24 and a wall of the housing 16a so that the concave part 28 and the outside of the wall of the housing 16a are connected to each other by the pipe 27. The porous block 26 is made, for example, of sintered metal, ceramic, or carbon. The porous block 26 can be also made of ceramic such as that used in the slide rail of an air slider (SLH-70AA, SLH-40AA manufactured by FUJITSU AUTOMATION CO. LTD.).

The pressured gas 15 supplied to the cavity 24 is ejected through the porous block 26 onto the surface of the layered body 107 (not shown in FIG. 7) to form a gas foil so that the gas pressure is uniformly applied to a fringe area on the surface of the layered body 107. The pressured gas 15 which is ejected through the porous block 26 and enters into the concave part 28 of the central block 26 is exhausted via the pipe 27. Because the gas 15 can be exhausted from the concave part 28, the pressure can be prevented from rising excessively at a central part of the surface of the layered body 107. Thereby, the damaging to the layered body 107 can be prevented.

Figure 8:
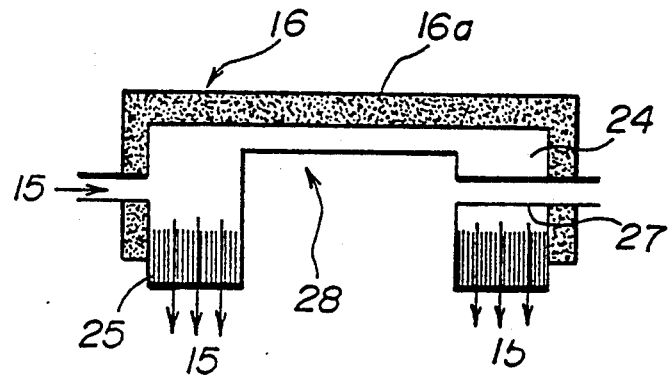
FIG. 8 is a diagram illustrating another example of a pressure device used in the apparatus shown in FIG. 7.

A metal block in which many through holes are formed can be substituted for the porous block 26. The pressured gas 15 can be supplied through the side wall of the housing 16a of the pressure device 16 to the cavity 24 of the pressure device 16, as shown in FIG. 8. In this case, the pipe 27 which is used as an exhaust pipe opening into the concave part 28 is provided so as to project from the side wall of the housing 16a of the pressure device 16, as shown in FIG. 8.

FIG. 9 shows another example of the adhering apparatus. Referring to FIG. 9, an adhering apparatus 31 has a regulator 22, a filter 23 and a pressure device 16 in the same manner as that of the above example shown in FIG. 7. The pressure device 16 is placed over a support plate 20 so as to move up and down. The pressure device 16 has the same structure as that shown in FIG. 7. That is, the pressure device 16 shown in FIG. 9 has the housing 16a, the central block 26 and the porous block 25 which is ring-shaped. The pressured gas supplied to the pressure device 16 is ejected through the porous block 25. The adhering apparatus 31 has a valve 32. The valve 32 selects a first path through which a heated gas 15a passes or a second path through which a cooled gas 15b passes. The heated gas 15a passing through the first path and the cooled gas 15b passing through the second path are selectively supplied via the valve 32 to the regulator 22. The heated or cooled gas from the regulator 22 is fitered by the filter 23 and supplied to the pressure device 16.

In a case where the substrate is adhered to the supporting block by the adhesive which is sandwiched between the substrate and the supporting block, the valve 32 selects the first path so that the heated gas 15a is supplied to the pressure device 16. Then the heated gas 15a is ejected from the pressure device 16 onto a fringe area on the surface of the substrate so that the heated gas applies pressure to the substrate. As a result, the substrate is pressed via the adhesive against the supporting block under a condition in which the adhesive is maintained at the curing temperature thereof for a predetermined time (a curing time of the adhesive). After the predetermined time elapses, the valve 32 switches from the first path to the second path so that the cooled gas 15 is supplied to the pressure device 16. The cooled gas 15b which has been substituted for the heated gas 15a is ejected from the pressure device 16 onto the fringe area on the surface of the substrate so that the cooled gas applies pressure is applied to the substrate. Thus, the adhesive is cooled by the cooled gas 15b under a condition in which the substrate is being pressed via the adhesive against the supporting block. After the adhesive is cooled for a predetermined time, the process for adhering the substrate to the supporting block is completed.

In the adhering apparatuses 21 and 31 shown in FIGS. 7 and 9, the filter 23 needs to have a function for removing particles greater than each distance between pattern blocks in the X-ray absorbing pattern.

The present invention can be used for adhering materials to each other for fabricating the exposure mask such as the X-ray exposure mask. In this case, the gas pressure can be applied to a whole surface of the substrate so that the substrate is pressed via the adhesive against the supporting block.

The present invention is not limited to the aforementioned embodiments, and variations and modifications may be made without departing from the scope of the claimed invention.

What is claimed is:

1. A method for fabricating an exposure mask comprising the following steps (a) through (d) of:
   (a) forming a layered body comprising a substrate having upper and lower major surfaces, a membrane transparent to an X-ray and provided on the upper major surface of said substrate, and an X-ray absorbing film provided on an upper major surface of said membrane;
   (b) adhering a support ring on the lower major surface of said substrate, said supporting ring having ring-shaped upper and lower major surfaces connected with each other by a side wall, said step (b) comprising steps of:
   (b-1) placing an adhesive layer between the lower major surface of said substrate and the upper major surface of said support ring; and
   (b-2) adhering said support ring to said layered body by applying a gas pressure on an upper major surface of said layered body so that said layered body is pressed via said adhesive layer against said support ring and adhered thereto by said adhesive layer;
   (c) carrying out etching on an area on the lower major surface of said substrate until a lower major surface of said membrane is exposed, the area corresponding to an inside of said support ring; and
   (d) patterning said X-ray absorbing film into a desired semiconductor pattern.

2. A method as claimed in claim 1, wherein said step (b-1) comprises a step of placing a thermosetting adhesive layer between the lower major surface of said substrate and said support ring, and
   wherein said step (b-2) further comprises a step (b-3) of heating said thermosetting adhesive at a predetermined temperature to cure the thermosetting adhesive layer.

3. A method as claimed in claim 1, wherein said step (b-2) comprises a first step of placing a structure obtained in said step (b-1) on a support plate in which a heater is provided, and a second step of activating the heater in said support plate on which said structure is placed, so that said adhesive layer is heated via said support ring during said gas pressure is applied to the upper major surface of said layered body.

4. A method as claimed in claim 1, wherein said step (b-2) comprises a step of applying a heated gas pressure on the upper major surface of said layered body so that said layered body is pressed via said adhesive layer to said support ring during said adhesive layer is heated by the heated gas pressure via said layered body.

5. A method as claimed in claim 4, wherein said step (b-2) further comprises a first step of placing a structure obtained in said step (b-1) on a support plate in which a heater is provided, and a second step of activating the heater in said support plate on which said structure is placed, so that said adhesive layer is heated by the heater and the heated gas pressure during said heated gas pressure is applied to the upper surface of said layered body.

6. A method as claimed in claim 2, wherein said step (b) further comprises a step (b-4) of applying a cooled gas pressure to the upper major surface of said layered body after said thermosetting adhesive is heated for a predetermined period in said step (b-3), so that said thermosetting adhesive is cooled under a condition in which said layered body is pressed via said thermosetting adhesive against said support ring after heating said thermosetting adhesive.

7. A method as claimed in claim 1, wherein said step (b-2) comprises a step of applying the gas pressure to only a fringe area on the upper major surface of said layered body, the fringe area corresponding to a ring shape of said support ring.

8. A method for adhering a substrate to a support block comprising the following steps (a) and (b) of:
   (a) placing an adhesive layer between a lower major surface of said substrate and an upper major surface of said support block; and
   (b) adhering said substrate to said support block by applying a gas pressure on an upper major surface of said substrate so that said substrate is pressed via said adhesive layer against said support block and adhered thereto by said adhesive layer.

9. A method as claimed in claim 8, wherein said step (a) comprises a step of placing a thermosetting adhesive layer between the lower major surface of said substrate and said support block, and wherein said method further comprises a step (c) of heating said thermosetting adhesive at a predetermined temperature.

10. A method as claimed in claim 8, wherein said step (b) comprises a first step of placing a structure obtained in said step (a) on a support plate in which a heater is provided, and a second step of activating a heater provided in said plate on which said support block is set, so that said adhesive layer is heated via said support block during the gas pressure is applied to the upper major surface of said substrate.

11. A method as claimed in claim 8, wherein said step (b) comprises a step of applying a heated gas pressure on the upper major surface of said substrate so that said substrate is pressed via said adhesive layer to said support block during said adhesive layer is heated by the heated gas pressure via said substrate.

12. A method as claimed in claim 11, wherein said step (b) further comprises a first step of placing a structure obtained in said step (a) on a support plate in which a heater is provided, and a second step of activating the heater in said support plate on which said structure is placed, so that said adhesive layer is heated by the heater and the heated gas pressure during said heated gas pressure is applied to the upper surface of said layered body.

13. A method as claimed in claim 9 further comprising a step (d) of applying a cooled gas pressure to the upper major surface of said substrate after said thermosetting adhesive is heated for a predetermined period in said step (c), so that said thermosetting adhesive layer is cooled under a condition in which said substrate is pressed via said thermosetting adhesive against said support block after heating said thermosetting adhesive.

14. A method as claimed in claim 8, wherein said step (a) comprises a step of placing said adhesive layer between the lower major surface of said substrate and a support ring block which is ring-shaped, and wherein said step (b) comprises a step of applying the gas pressure to only a fringe area on the upper major surface of said substrate, the fringe area corresponding to a ring shape of said support ring block.

* * * * *

UNITED STATES PATENT AND TRADEMARK OFFICE
CERTIFICATE OF CORRECTION

PATENT NO. : 5,185,054
DATED : February 9, 1993
INVENTOR(S) : KONDO

It is certified that error appears in the above-indentified patent and that said Letters Patent is hereby corrected as shown below:

Col. 2, line 33, after "invention is" insert --to--.

Col. 6, line 12, change "the damaging" to --damage--;
line 62, delete "is applied".

Col. 7, line 17, (claim 1, line 2) delete "following" and delete "(a) through (d)";
line 58, (claim 3, line 7) change "during" to --while--;
line 64, (claim 4, line 5) change "during" to --while--.

Col. 8, line 4, (claim 5, line 7) change "during" to --while--;
line 22, (claim 8, line 2) delete "following" and delete "(a) and (b)";
line 43, (claim 10, line 7) change "during" to --while--;
line 49, (claim 11, line 5) change "during" to --while--;
line 57, (claim 12, line 7) change "during" to --while--.

Signed and Sealed this

Ninth Day of August, 199

Attest:

BRUCE LEHMAN

Attesting Officer

Commissioner of Patents and Trademarks